United States Patent
Oh et al.

(10) Patent No.: US 7,972,890 B2
(45) Date of Patent: Jul. 5, 2011

(54) METHODS OF MANUFACTURING IMAGE SENSORS

(75) Inventors: Tae-seok Oh, Seoul (KR); Duk-seo Park, Suwon-si (KR); Jong-wook Hong, Seoul (KR); Jung-Hyeok Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 964 days.

(21) Appl. No.: 11/898,578

(22) Filed: Sep. 13, 2007

(65) Prior Publication Data
US 2008/0070342 A1    Mar. 20, 2008

(30) Foreign Application Priority Data

Sep. 20, 2006   (KR) .................. 10-2006-0091338

(51) Int. Cl.
 *H01L 21/00*   (2006.01)
(52) U.S. Cl. ................... 438/70; 438/200; 257/E21.352
(58) Field of Classification Search .................... 438/71, 438/74; 257/E21.352, E21.536
 See application file for complete search history.

(56) References Cited

U.S. PATENT DOCUMENTS

| 2006/0054946 A1* | 3/2006 | Baek et al. ............... 257/292 |
| 2007/0284687 A1* | 12/2007 | Rantala .................. 257/432 |

FOREIGN PATENT DOCUMENTS

| JP | 2001-320079 | 11/2001 |
| KR | 101998072450 | 11/1998 |
| KR | 1020040007940 | 1/2004 |
| KR | 10-2004-0106229 | 12/2004 |
| KR | 10-2005-0069657 | 7/2005 |
| KR | 10-2006-0077071 | 7/2006 |

OTHER PUBLICATIONS

Korean Office Action dated Aug. 29, 2007.

\* cited by examiner

*Primary Examiner* — Chandra Chaudhari
(74) *Attorney, Agent, or Firm* — Harness, Dickey & Pierce, PLC

(57) ABSTRACT

Example embodiments may provide methods of manufacturing an image sensor. Example methods of manufacturing an image sensor may include forming a photoelectric converter in a semiconductor substrate, forming an interlayer insulating film covering a surface of the semiconductor substrate, forming metal wires and an inter-metal insulating film filling between the metal wires on the interlayer insulating film, forming openings above the photoelectric converter by removing a part of the inter-metal insulating film and the interlayer insulating film, curing the surface above the photoelectric converter by irradiating light into the openings, and/or forming a light transmitter filling the openings.

16 Claims, 9 Drawing Sheets

METHODS OF MANUFACTURING IMAGE SENSORS

PRIORITY STATEMENT

This non-provisional patent application claims priority under §119 to Korean Patent Application No. 10-2006-0091338 filed on Sep. 20, 2006 in the Korean Intellectual Property Office, the entire contents of which are incorporated herein by reference.

BACKGROUND

1. Field

Example embodiments may relate to methods of manufacturing an image sensor, and particularly to a method of manufacturing an image sensor with reduced dark current.

2. Description of the Related Art

An image sensor may convert optical images into electric signals. As computers and related technology develop, demand for image sensors has increased for a variety of fields such as digital cameras, camcorders, PCS (Personal Communication System), games, security cameras, medical micro cameras, robots, and other applications.

In related art image sensors, a unit pixel may photoelectrically convert incident light and may accumulate electric charge corresponding to the quantity of the light in a photoelectric converter, and image signals may be generated through a read-out operation. Generally, the greater the quantity of light received by the photoelectric converter, the potentially better the sensitivity. An interlayer insulating film, an inter-metal insulating film, and/or an etch stop film may be layered above the photoelectric converter and may reflect or disperse incident light and reduce the quantity of light received by the photoelectric converter.

A related art process for removing the interlayer insulating film, inter-metal insulating film, and/or etch stop film above the photoelectric converter may be applied. Related art processes removing films may be applied by a dry etching process using plasma. If dry etching using plasma is applied, plasma damage may be caused by plasmatic etching gas. The plasma damage may increase dark current and/or deteriorate characteristics of image sensors.

SUMMARY

Example embodiments may provide a method of manufacturing an image sensor with reduced dark current.

Example embodiments may provide a method of manufacturing an image sensor including forming a photoelectric converter in a semiconductor substrate, forming an interlayer insulating film covering a surface of the semiconductor substrate, forming metal wires and/or an inter-metal insulating film filling between the metal wires on the interlayer insulating film, forming openings above the photoelectric converter by removing a part of the inter-metal insulating film and/or the interlayer insulating film, curing the surface above the photoelectric converter by irradiating light to the openings, and/or forming a light transmitter filling the openings.

BRIEF DESCRIPTION OF THE DRAWINGS

The above and other features and/or advantages of example embodiments will become more apparent by describing in detail the attached drawings in which.

DESCRIPTION OF THE PREFERRED EMBODIMENTS

Figure 1:
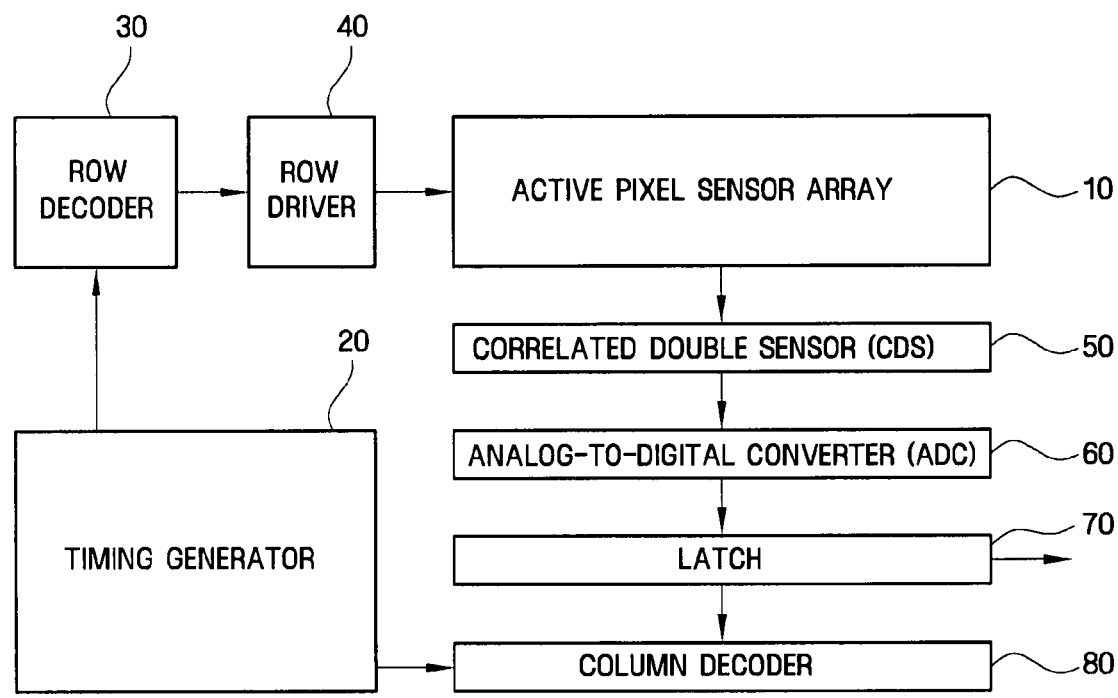
FIG. 1 is a block diagram of an example embodiment image sensor.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout An example embodiment image sensor may include CCDs (Charge Coupled Device) and CMOS image sensors. CCDs may have less noise and/or better picture quality than CMOS image sensors, but CCDs may require higher voltage and/or manufacturing cost. CMOS image sensors may use a variety of scanning methods with simple driving methods. A signal processing circuit may be integrated in a single chip and CMOS processing technologies are compatible, so that it may be possible to fabricate smaller CMOS image sensors and/or reduce manufacturing cost. CMOS image sensor power consumption may be lower, and CMOS image sensors may be easily applied to products having limited battery capacity. A CMOS image sensor may be described herein as an example of an image sensor. CCD may also be applicable to example embodiments.

FIG. 1 is a block diagram of an example embodiment image sensor.

As shown in FIG. 1, an example embodiment image sensor may include an active pixel sensor array (APS array) 10, a timing generator 20, a row decoder 30, a row driver 40, a correlated double sampler (CDS) 50, an analog-to-digital converter (ADC) 60, a latch 70, and/or a column decoder 80.

The active pixel sensor array 10 may include several unit pixels that may be arrayed in two dimensions. Pixels in the active pixel array 10 may convert optical images into electric signals. The active pixel sensor array 10 may be driven by receiving a plurality of driving signals of a pixel selecting signal (ROW), a reset signal (RST), and/or an electric charge transmitting signal (TG) from the row driver 40. Converted electric signals may be transmitted to the correlated double sampler 50 through a vertical signal line.

The timing generator 20 may provide timing signals and/or control signals to the row decoder 30 and the column decoder 80.

The row driver 40 may provide a plurality of driving signals for driving the pixels to the active pixel sensor array 10 on the basis of a decoding result of the row decoder 30. If the unit pixels are arranged in a matrix form, the row driver 40 may provide driving signals to each row.

The correlated double sampler 50 may receive electric signals generated in the active pixel sensor array 10 through the vertical signal line and may hold and/or sample the signals. The correlated double sampler 50 may sample a specific reference voltage level (hereinafter, called noise level) and a voltage level (hereinafter, signal level) by the electric signal and may output a difference level between the noise level and the signal level.

The analog-to-digital converter 60 may convert an analog signal corresponding to the difference level into a digital signal and output the digital signal.

The latch 70 may latches digital signals, and the latched signals may be sequentially outputted to an image signal processor (not shown) on the basis of decoding results at the column decoder 80.

Figure 2:
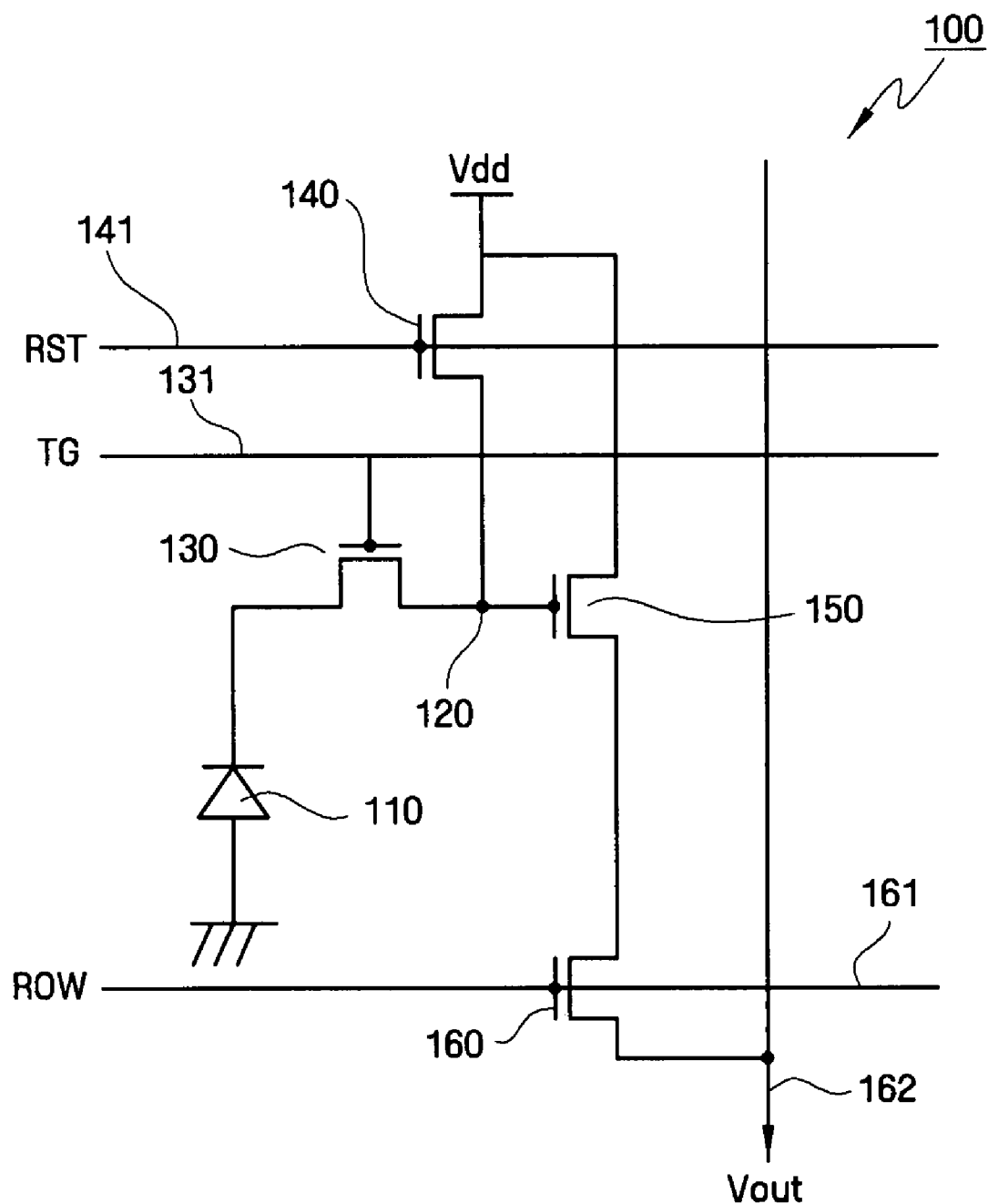
FIG. 2 is a circuit diagram of a unit pixel of an example embodiment image sensor.

FIG. 2 is a circuit diagram of a unit pixel of an example embodiment image sensor.

As shown in FIG. 2, a unit pixel 100 of an example embodiment image sensor may include a photoelectric converter 110, a charge detector 120, a charge transmitter 130, a resetter 140, an amplifier 150, and/or a selector 160. The unit pixel 100 may be composed of, for example, four transistors as shown in FIG. 2, or other numbers of transistors.

The photoelectric converter 110 may absorb incident light and/or accumulate electric charge corresponding to the quantity of light. The photoelectric converter 110 may be a photo diode, photo transistor, photo gate, and/or a pinned photo diode (PPD).

The charge detector 120 may be a floating diffusion region (FD) and may receive the accumulated electric charge at the photoelectric converter 110. Because the charge detector 120 may have a parasitic capacitance, electric charge may be cumulatively stored. The charge detector 120 may be electrically connected with a gate of the amplifier 150 and may control the amplifier 150.

The charge transmitter 130 may transmit electric charge from the photoelectric converter 110 to the charge detector 120. The charge transmitter 130 may be generally composed of one transistor and controlled by electric transmitting signals (TG).

The resetter 140 may periodically reset the charge detector 120. A source of the resetter 140 may be connected to the charge detector 120 and a drain of the resetter 140 may be connected to a Vdd. Further, the resetter 140 may be driven by responding to reset signals (RST).

The amplifier 150 may function as a source follower buffer amplifier with a constant current source (not shown) provided outside the unit pixel 100, and voltage that is changed by responding to voltage of the charge detector 120 may be outputted to the vertical signal line 162. The source of the amplifier 150 may be connected to the drain of selector 160 and the drain of the amplifier 150 may be connected to the Vdd.

The selector 160 may select the unit pixel 100 to read out in a row. The selector 160 may respond to selecting signals ROW and then driving, and the source of the selector 160 may be connected with the vertical signal line 162.

Driving signal lines 131, 141, and 161 of the charge transmitter 130, resetter 140, and/or selector 160 may extend in the row direction (horizontally) so that unit pixels in the same row may be simultaneously driven.

Figure 3:
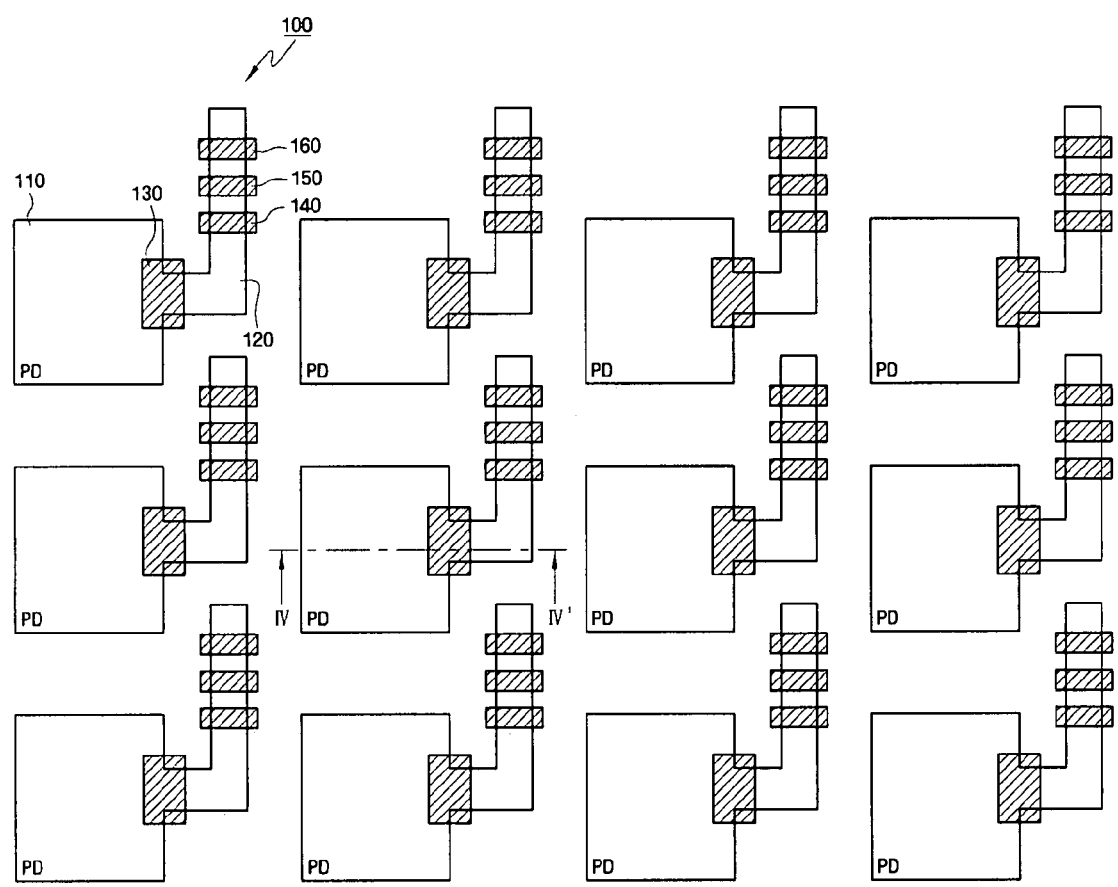
FIG. 3 is a schematic plan view of an active pixel sensor array of an example embodiment image sensor.
Figure 4:
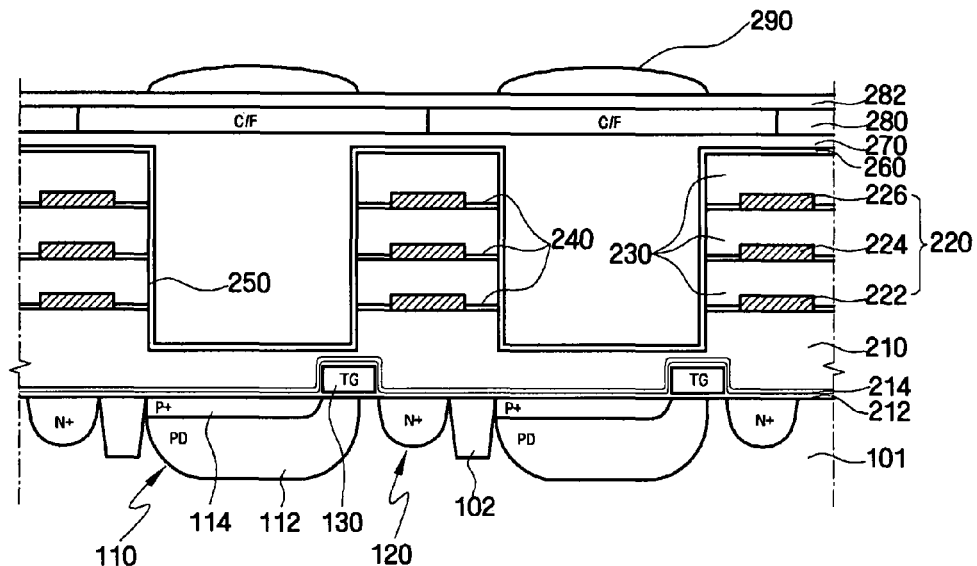
FIG. 4 is a cross-sectional view taken along a line IV-IV' of FIG. 3.

FIG. 3 is a schematic plan view of the active pixel sensor array of an example embodiment image sensor. FIG. 4 is a cross-sectional view taken along a line IV-IV' of FIG. 3.

As shown in FIGS. 3 and 4, an example embodiment image sensor may include the photoelectric converters 110 on the semiconductor substrate 101, the electric charge detectors 120, the charge transmitters 130, metal wires 220, inter-metal insulating films 230, light transmitters 270, color filters 280, and/or micro lenses 290.

Element separating regions 102 may be formed on the semiconductor substrate 101 and define active regions. The element separating region 102 may be, for example, a FOX (Field Oxide) and/or STI (Shallow Trench Isolation) that uses a LOCOS (LOCal Oxidation of Silicon) method.

The photoelectric converter 110 that may absorb electric charges generated by absorbing light energy may be on the active region on the semiconductor substrate 101 and may include an N-type photodiode 112 and a P+-type pinning layer 114.

The charge detector 120 may be on the semiconductor substrate 101, and transistors, which may correspond to the charge transmitter 130, the resetter 140, the amplifier 150, and/or the selector 160 may also be on the semiconductor substrate 101.

An interlayer insulating film 210 may be above the photoelectric converter 110 and/or the charge transmitter 130 to cover a surface of the semiconductor substrate 101 and/or fill empty spaces without transistors. The interlayer insulating film 210 may be, for example, a silicon oxide film ($SiO_2$). Alternatively, insulating films 212 and 214 may be under the interlayer insulating film 210 and/or oxide films and/or nitride films. The oxide film and/or the nitride film may be a silicide blocking film and/or an etch stop film.

The metal wires 220 and the inter-metal insulating films 230 may be on the interlayer insulating film 210. The metal wire 220 may be, for example, a single layer, or it may be multiple layers. For multiple-layered metal wire 220, the inter-metal insulating film 230, an interlayer insulating material, may be between an upper metal wire and a lower metal wire, and the upper metal wire 226 and the lower metal wire 222 may be connected through a via hole. An example embodiment with a metal wire having three layers 222, 224, and 226 is shown in FIG. 4.

The metal wire 220 may be, for example, formed of tungsten (W), copper (Cu), and/or another suitable material. The inter-metal film 230 may be, for example, FOX (Flowable Oxide), HDP (High Density Plasma), TOSZ (Tonen SilaZene), SOG (Spin On Glass), USG (Undoped Silica Glass), and/or another suitable material. In such a configuration, an etch stop film 240 may be formed between the inter-metal films 230 and may be formed of SiN.

The metal wire 220 may be in a region except for the photoelectric converter 110 in the active pixel sensor array. Openings 250 may be above the photoelectric converters 110 without the metal wire 220. The opening 250 may be spaced from the metal wire 220 and may pass through the inter-metal insulating film 230 and may extend in the interlayer insulating film 210. Light may enter into the photoelectric converter 110 and may be refracted and/or reflected by the inter-metal insulating film 230 and/or the etch stop film 240 above the photoelectric converter 110, so that light transmission may decrease and/or crosstalk may appear. For this reason, the opening 250 may be formed to increase the light transmission by preventing light absorption, scatter, and/or crosstalk.

An oxide film 260 may be on the base and sides of the opening 250. The oxide film 260 may be formed on a surface of the opening 250 and the uppermost inter-metal insulating film and may protect a portion under the opening 250.

The light transmitter 270 may fill the openings 250 and may flatten the above portion of the openings 250. The light transmitter 270 may be formed of a transparent material to transmit light and may be, for example, thermosetting resin.

The color filters 280 may be on the light transmitter 270, in which reds, greens, and/or blues may be arrayed in a Bayertype pattern. Green color filters 280, which may require more accuracy because human eyes are most sensitive to it, may be arranged in about half of the color filter 280. Other arrangements of the color filter 280 are possible for different applications.

The micro lens 290 may be formed at a position corresponding to the photoelectric converter 110 on the color filter 280. The micro lens 290 may be, for example, formed of TMR-based resin and/or MFR-based resin. The micro lens 290 may shift the path of light entering regions outside of the photoelectric converters 110 and may concentrate light on the photoelectric converters 110.

A flattening layer 282 may be formed between the color filters 280 and the micro lenses 290, and, for example, thermosetting resin.

Figure 5:
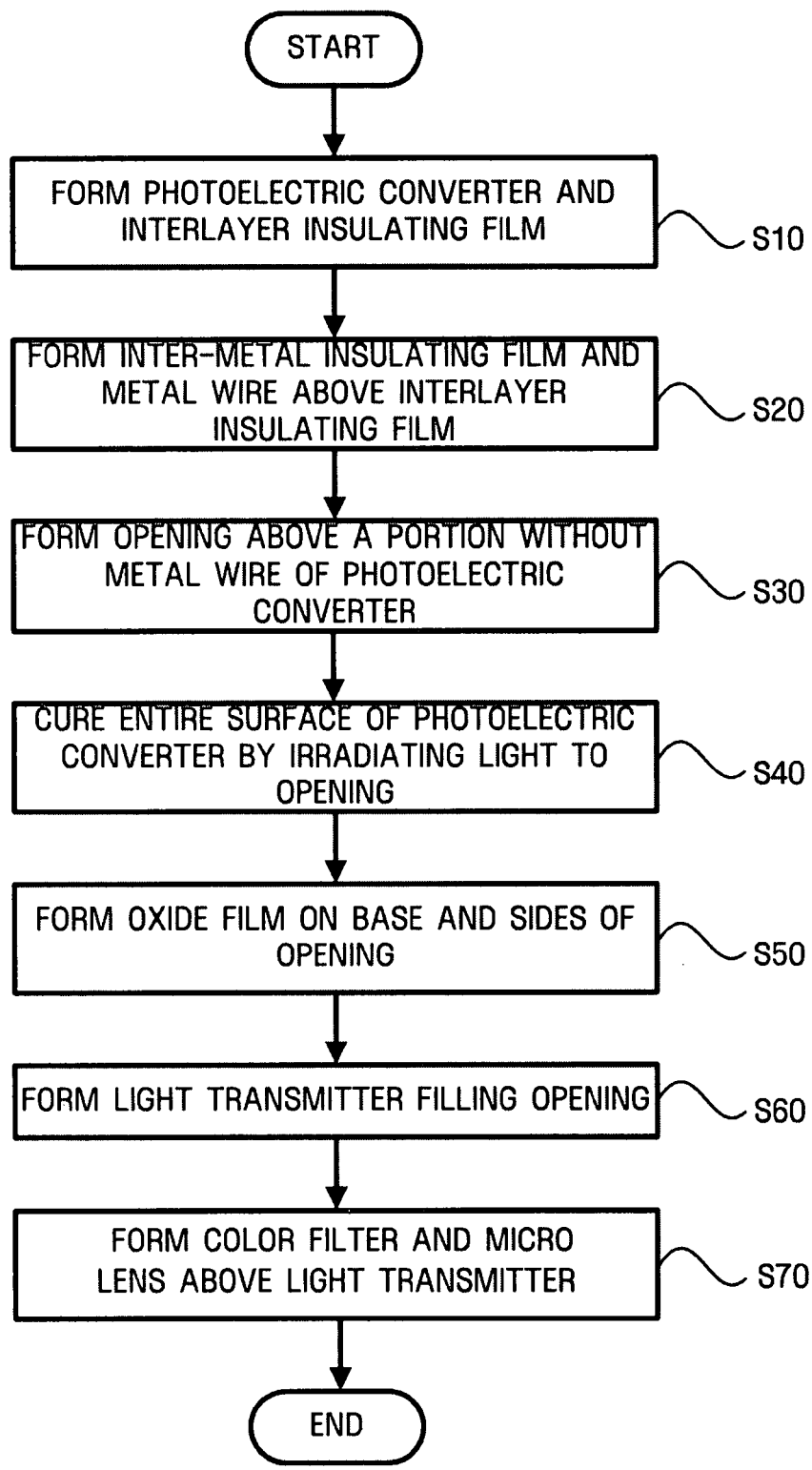
FIG. 5 is a flowchart illustrating an example embodiment method of forming an image sensor.

An example embodiment method of manufacturing an image sensor is now described hereafter with reference to FIGS. 5 to 11. FIG. 5 is a flowchart illustrating an example embodiment method of manufacturing an image sensor. FIGS. 6 to 11 are cross-sectional views illustrating an example embodiment method of manufacturing an image sensor.

Figure 6:
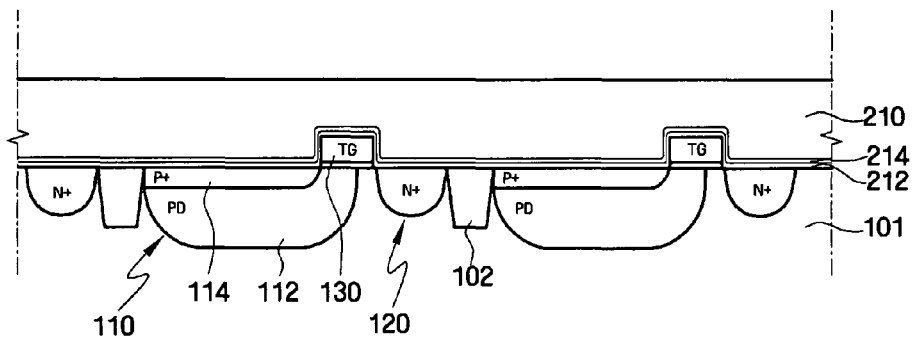
FIGS. 6 to 11 are cross-sectional views illustrating an example embodiment method of manufacturing an image sensor.

As shown in FIGS. 5 and 6, photoelectric converters 110 and/or an interlayer insulating film 210 may be formed on a semiconductor substrate 101 (S10). First, element separating regions 102 may be formed on the semiconductor substrate 101 to define active regions (not shown). Photoelectric converters 110 including photodiodes 112 and pinning layers 114, transistors corresponding to electric charge detectors 120 and charge transmitters 130, resetters (140 in FIG. 2), amplifiers (150 in FIG. 2), and/or selectors (160 in FIG. 2) may be formed by doping impurities into the active region. The interlayer insulating film 210 may be formed such that it covers the whole surface of the semiconductor substrate 101 and fills empty spaces between transistors. Insulating films 212 and 214 may be formed on the photoelectric converters 110 before the interlayer insulating film 210 is formed. The insulating films 212 and 214 may be an oxide film and/or a nitride film. The oxide film and/or the nitride film may be a silicide blocking film or an etch stop film.

Figure 7:
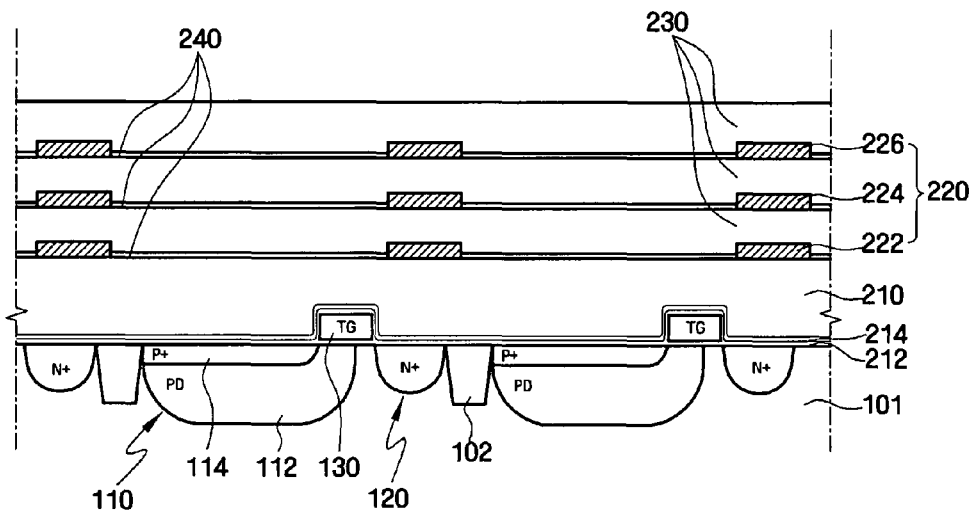
Figure 8:
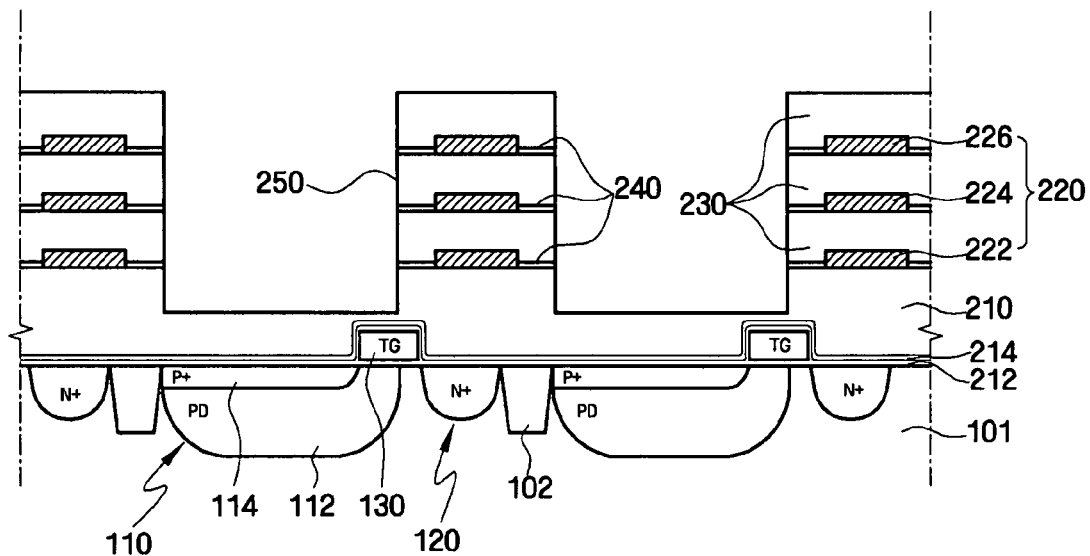

As shown in FIGS. 5 and 7, inter-metal layers 230 and a metal wire 220 may be formed on the interlayer insulating film 210 (S20). An etch stop film 240 may be formed between a plurality of inter-metal insulating films 230. For multi-layered metal wire 220, the inter-metal insulating film 230, which may be an interlayer insulating material, may be filled between an upper metal wire and a lower metal wire, and upper and lower metal wires may be connected through a via hole As shown in FIGS. 5 and 8, openings 250 may be formed above the portions without the metal wires 220 of the photoelectric converter 110 (S30). A photo-resist pattern may be formed above the portions without the metal wires 220 of the photoelectric converter 110, and then the openings 250 may be formed by using the photo-resist pattern as an etch mask, in which all of the inter-metal insulating layer 230 and/or the etch stop film 240 may be etched and in which a part of the interlayer insulating film 210 may also be etched. Etch process for forming the openings 250 may be dry etching using plasma, for example, reactive ion etching (RIE).

The opening 250 may be spaced from the metal wire 220 and may pass through the inter-metal insulating film 230 and may extend in the interlayer insulating film 210. The etching depth may be shallow enough to reduce or prevent damage to the transistors under the interlayer insulating film 210, and the transistors may be less damaging to the photoelectric converter 110 due to the etch process. Because plasma damages may be cured in example methods, it may be possible to form the openings 250 deep. For example, about ½ or more of the interlayer insulating films 212 and 214 on the photoelectric converter 110 may be removed.

As the plasma etching is applied to form the openings 250, plasma damages may occur on the surface above the photoelectric converter 110 by plasmatic etching gas. The surface above and/or the insulating films 212 and 214 on the photoelectric converter 110 may be affected by the plasmatic etching gas.

Figure 9:
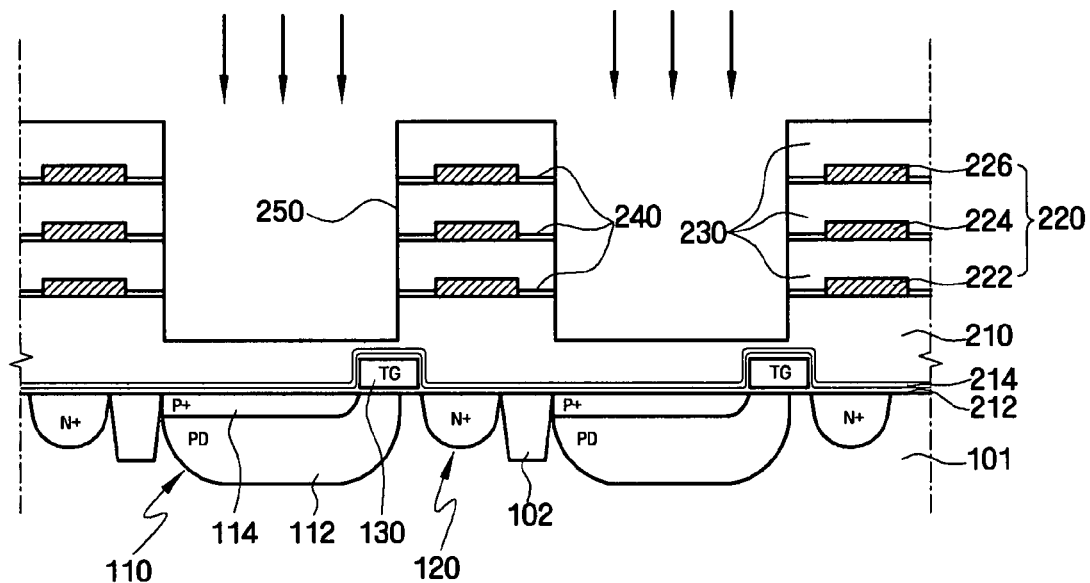

As shown in FIGS. 5 and 9, the surface above the photoelectric converter 110 may be cured by irradiating light in the openings 250 (S40). The light to irradiate to the openings 250 may be ultraviolet rays, and the wavelength may be about 100 to about 300 nm. The light may irradiate for a time to cure damages caused in forming the openings 250, for example, about 2 to about 20 minutes.

As light is irradiated in the openings 250, the damaged surface above the photoelectric converter 110 or the insulating films 212 and 214 may be cured. Damages from plasma may cause dark current to increase, and dark current may be reduced by curing the surface above the photoelectric converter 110 and/or the insulating films 212 and 214.

Figure 10:
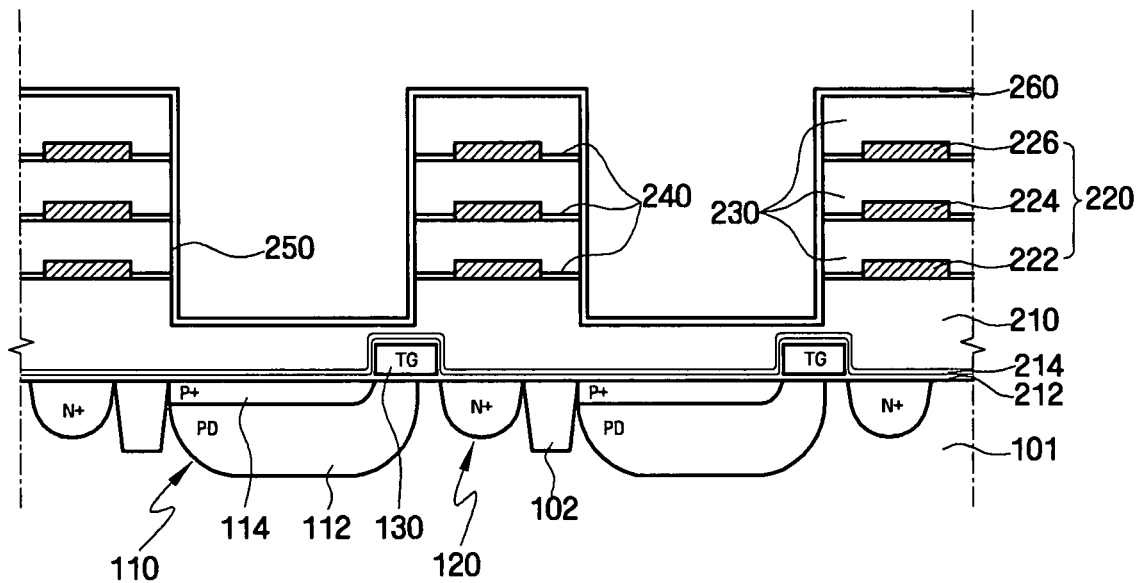

As shown in FIGS. 5 and 10, an oxide film 260 may be formed on the base and sides of the openings 250 (S50).

The CVD (Chemical Vapor Deposition) method may be used to form the oxide film 260. When the width of the opening 250 is within about 1000 to about 2000 Å, the oxide film may be formed with a thickness in the range of about 100 to about 200 Å.

Figure 11:
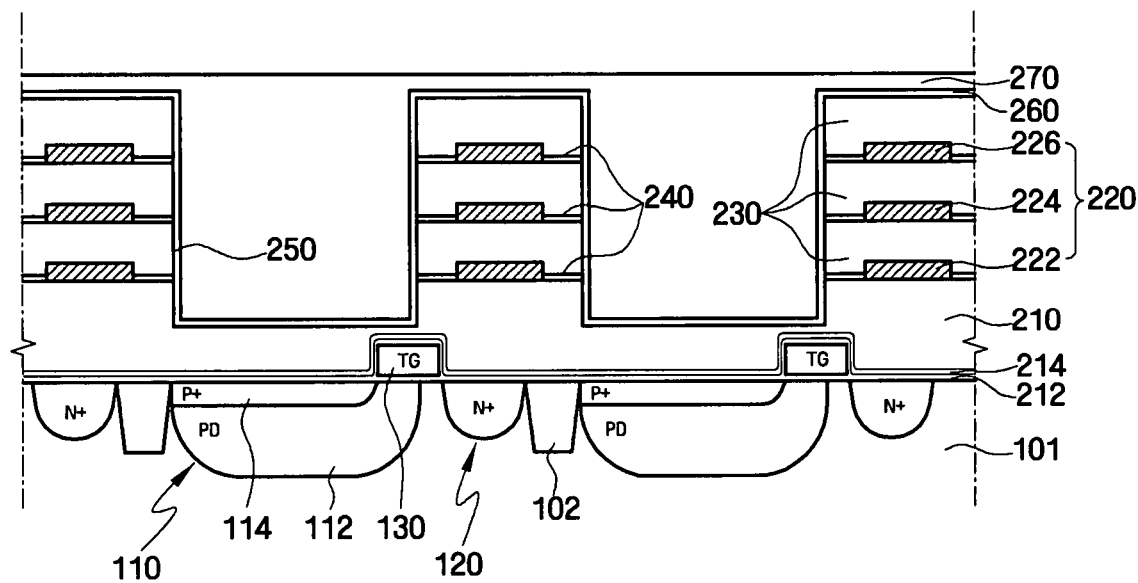

As shown in FIGS. 5 and 11, a light transmitter 270 that fills the openings 250 may be formed (S60). The light transmitter 270 may fill the openings 250 and cover the upper inter-metal insulating films 212 and 214. The light transmitter 270 may be a transparent material that may transmit light and may be formed of, for example, thermosetting resin. If the light transmitter 270 is formed of thermosetting resin, the openings 250 may be filled with the thermosetting resin by spin-on coating and the resin may be hardened by heating.

As shown in FIGS. 4 and 5, color filters 280 and micro lenses 290 may be formed above the light transmitter 270 (S70).

First, the color filters 280 are formed above the light transmitter 270. The color filters 280 may be arranged in a Bayer-type configuration with reds, greens, and/or blues. A flattening layer 282 may be formed on the color filters 280. The flattening layer 282 may be formed to flatten the upsides of the color filters 280 and may be formed of thermosetting resin. The flattening layer 282 may be formed by providing thermosetting resin using spin-on coating and then hardening the thermosetting resin by heating. Following the flattening layer 282, the micro lenses 290 may be formed at positions corresponding to the photoelectric converter 110 on the flattening layer 282.

Regarding an example embodiment method of manufacturing an image sensor, plasma damages from the process of manufacturing the image sensor may be cured. Dark current may be reduced or prevented and characteristics of the image sensor may be improved.

Figure 12:
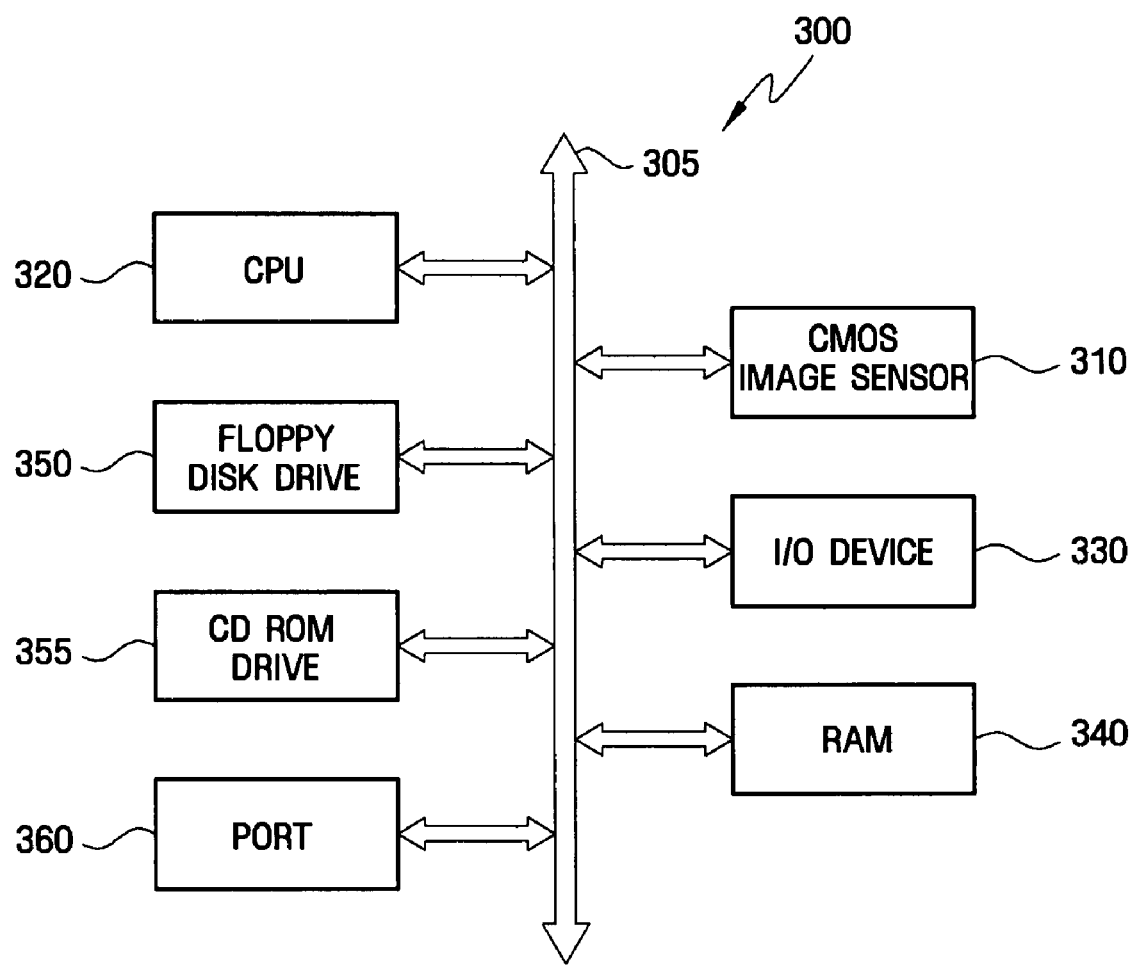
FIG. 12 is a schematic view of a program-based system including an example embodiment image sensor.

FIG. 12 is a schematic view illustrating an example embodiment processor-based system including an image sensor.

As shown in FIG. 12, a processor-based system 300 may process output images of a CMOS image sensor 310. The system 300 may be, for example, a computer system, camera system, scanner, mechanical watch system, navigation system, video phone, supervising system, automatic focus system, tracking system, motion-monitoring system, image-stabilizing system, and/or any other suitable application.

The processor-base system 300, for example a computer system, may include a CPU 320, for example, a microprocessor, which may communicate with an I/O element 330 through a bus 305. The CMOS image sensor 310 may communicate with the system through the bus 305 or other communication links. The processor-based system 300 may include a RAM 340, floppy disc drive 350 and/or CD-ROM drive 355, and/or a port 360 that can communicate with the CPU 320 through the bus 305. The port 360 may be a port that can couple a video card, sound card, memory card, USB element etc, and/or communicate data with other systems. The CMOS image sensor 310 may be integrated with a CPU, a digital signal processor (DSP), a microprocessor, and/or another suitable device. Further, a memory may also be integrated with the CMOS. Alternatively, the CMOS may be integrated with a different chip from a processor.

Figure 13:
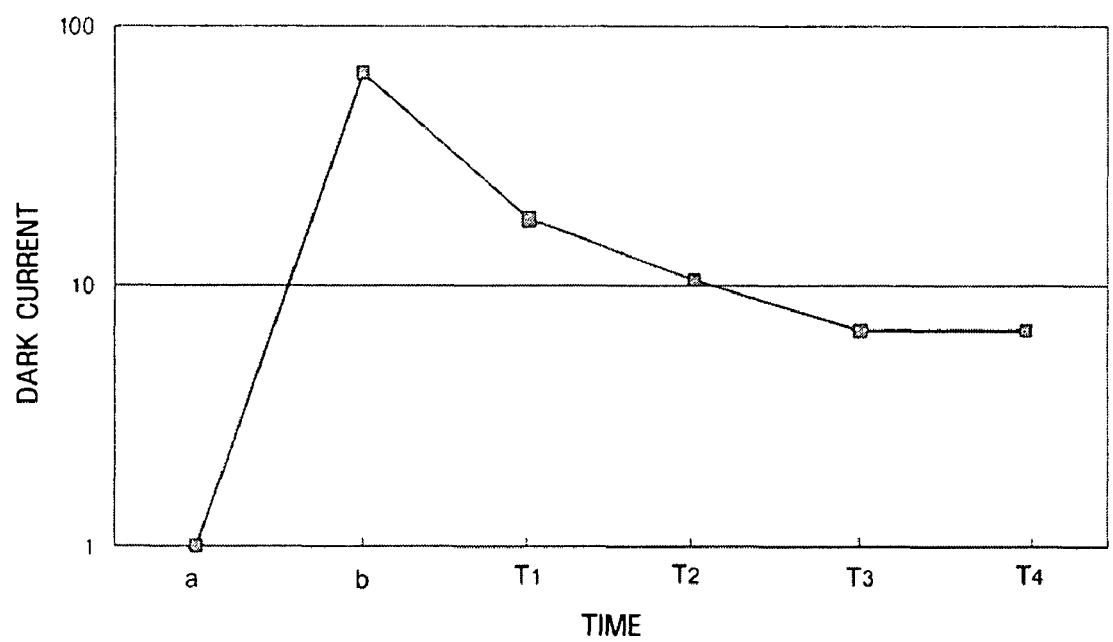
FIG. 13 is a graph showing measurements of dark current if curing is applied or not applied to an example embodiment image sensor manufactured by an example embodiment method of manufacturing an image sensor.

FIG. 13 is a graph showing measurements of dark current based on curing application in an image sensor manufactured by an example embodiment method of manufacturing an image sensor.

The axis of ordinate of the graph represents standardized dark current. On the axis of abscissa, 'a' represents a configuration before the openings are formed and 'b' represents a configuration after the openings are formed. T1 represents when curing starts, and the curing continues to T4.

As shown in FIG. 13, dark current may increase at (b) after the openings are formed compared to (a) before the openings are formed. It can be seen that as curing is applied, the dark current may decrease. The dark current continually decreases most from T1 to T3, and decreases less at T4 compared with T3. As a result, if curing continues for a certain time while the dark current continually decreases, it may be possible to decrease dark current.

While example embodiments have been particularly shown and described with reference to the example embodiments shown in the figures, it will be understood by those of ordinary skill in the art that various changes in form and details may be made therein without departing from the spirit and scope of the following claims.

What is claimed is:

1. A method of manufacturing an image sensor, comprising:
    forming a photoelectric converter in a semiconductor substrate;
    forming an interlayer insulating film covering a surface of the semiconductor substrate;
    forming a plurality of metal wires on the interlayer insulating film, the plurality of metal wires having a plurality of inter-metal insulating films, each inter-metal insulating film of the plurality of inter-metal insulating films alternating with each metal wire of the plurality of metal wires;
    plasma etching a portion of the plurality of inter-metal insulating film and the interlayer insulating film to form an opening above the photoelectric converter;
    curing a plasma-etched surface of the opening by irradiating the plasma-etched surface of the opening with light, so as to remove damage to the plasma-etched surface by the plasma etching; and
    filling the opening with a light transmitter.

2. The method of claim 1, wherein the light used in irradiating the opening is ultraviolet light.

3. The method of claim 2, wherein the wavelength of the ultraviolet light is about 100 nm to about 300 nm.

4. The method of claim 1, wherein the curing is performed for about 2 minutes to about 20 minutes.

5. The method of claim 1, further comprising:
    forming an insulating film above the photoelectric converter before forming the interlayer insulating film.

6. The method of claim 5, wherein curing the plasma-etched surface of the opening with light cures the plasma-etched insulating film by irradiating the plasma-etched insulating film with light.

7. The method of claim 1, wherein plasma-etching the portion of the interlayer insulating film removes about half or more of the interlayer insulating film formed above the photoelectric converter.

8. The method of claim 1, wherein plasma-etching a portion of the inter-metal insulating film and the interlayer insulating film includes forming a photo-resist pattern on the inter-metal insulating film and plasma-etching a portion of the inter-metal insulating film and the interlayer insulating film using the photo-resist pattern as an etch mask.

9. The method of claim 1, wherein the plasma etching process uses reactive ion etching.

10. The method of claim 1, wherein plasma etching a portion of the inter-metal insulating film and the interlayer insulating film forms the opening spaced apart from the metal wire.

11. The method of claim 1, further comprising:
forming an etch stop film between each adjacent inter-metal insulating film of the plurality of inter-metal insulating films.

12. The method of claim 11, further comprising:
removing a portion of the etch stop film simultaneously with plasma etching the portion of the plurality of inter-metal insulating films and the interlayer insulating film.

13. The method of claim 1, wherein the light transmitter is a thermosetting resin.

14. The method of claim 1, further comprising:
forming an oxide film on the opening in conformity with surfaces of the opening before filling the opening.

15. The method of claim 1, further comprising:
forming a color filter above the light transmitter after the forming of the light transmitter; and
forming a micro lens above the color filter.

16. The method of claim 1, further comprising;
forming a charge detector and a charge transmitter on the semiconductor substrate before forming the interlayer insulating film, the charge transmitter configured to transmit electric charge accumulated in the charge detector to the photoelectric converter from the electric charge detector.

* * * * *